United States Patent
Kajiki (10) Patent No.: US 8,766,188 B2
(45) Date of Patent: Jul. 1, 2014

(54) PHOTOCONDUCTIVE ELEMENT

(75) Inventor: Kousuke Kajiki, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 330 days.

(21) Appl. No.: 13/038,222

(22) Filed: Mar. 1, 2011

(65) Prior Publication Data

US 2011/0215246 A1    Sep. 8, 2011

(30) Foreign Application Priority Data

Mar. 2, 2010   (JP) ................... 2010-044839

(51) Int. Cl.
  *G01J 5/20* (2006.01)
(52) U.S. Cl.
  USPC ........................................ 250/338.4
(58) Field of Classification Search
  USPC ........................................ 250/338.4
  See application file for complete search history.

(56) References Cited

U.S. PATENT DOCUMENTS 7,170,085 B2 * 1/2007 Raspopin et al. ............... 257/21
7,174,037 B2 * 2/2007 Arnone et al. ............... 382/128
7,498,593 B2 * 3/2009 Shen et al. ............... 250/504 R

FOREIGN PATENT DOCUMENTS

JP   62-90985 A    4/1987
JP   05-291371 A   11/1993
JP   2006-86227 A   3/2006

* cited by examiner

*Primary Examiner* — David Porta
*Assistant Examiner* — Kenneth J Malkowski
(74) *Attorney, Agent, or Firm* — Canon USA, Inc. IP Division (57) ABSTRACT

A photoconductive element for performing at least one of generation and detection of terahertz radiation includes a photoconductive layer formed of a semiconductor material and configured to generate photoexcited carriers by being irradiated with excitation light, and a plurality of electrodes provided on the photoconductive layer. The material of the photoconductive layer is a material that makes a depletion layer produced in the photoconductive layer have a thickness smaller than an optical absorption length of the photoconductive layer for a wavelength of the excitation light. A film thickness of the photoconductive layer is adjusted so that the depletion layer is formed over an entirety in a direction of the film thickness within at least a portion of the photoconductive layer between the plurality of electrodes.

6 Claims, 4 Drawing Sheets

PHOTOCONDUCTIVE ELEMENT

BACKGROUND OF THE INVENTION

1. Field of the Invention

The present invention relates to a photoconductive element and to a terahertz radiation analysis apparatus including the photoconductive element.

2. Description of the Related Art

Terahertz (THz) radiation is electromagnetic action having components within an arbitrary frequency band ranging from 0.03 THz to 30 THz. Characteristic absorption spectra arising from the structure or state of various substances such as biomolecules are obtained in the terahertz wave band. Inspection techniques for performing nondestructive analysis and identification of substances while taking advantage of the above features are being developed. There is also an expectation of application to safer imaging techniques that could replace X-ray based imaging techniques or high-speed communication technologies. Photoconductive elements are available as generation/detection elements configured to perform at least one of the generation and detection of terahertz radiation. The photoconductive elements generally include a photoconductive layer formed in contact with a substrate, and electrodes formed in contact with the photoconductive layer. The electrodes are typically an electrode pair (two electrodes). A photoconductive layer of gallium arsenide (GaAs) has been widely used. When a photoconductive element is used as a generation element, typically, a voltage is applied between electrodes, and the gap between the electrodes is irradiated with excitation light (femtosecond laser light having a wavelength absorbed by the photoconductive layer). Photoexcited carriers generated by the irradiation with the excitation light are accelerated in the electric field between the electrodes, and terahertz radiation is generated. Further, when a photoconductive element is used as a detection element, typically, the gap between electrodes is irradiated with terahertz radiation and excitation light. Photoexcited carriers generated by the irradiation with the excitation light are accelerated in the electric field of terahertz radiation, and an electric current is generated between the electrodes. The electric field strength of the terahertz radiation can be measured by measuring the electric current.

Japanese Patent Laid-Open No. 2006-86227 discloses an example of a photoconductive element. The photoconductive element disclosed in Japanese Patent Laid-Open No. 2006-86227 includes a photoconductive layer formed of an indium gallium arsenide (InGaAs) layer which can efficiently absorb excitation light in the 1.5 μm band, which is generally available in optical fiber technology. In a case where such a photoconductive element is used, the photoconductive element has a relatively low resistance.

The use of a low-resistance photoconductive element as a terahertz radiation generation or detection element may lead to the following suggestions: In a case where the above photoconductive element is used as a generation element, due to the low resistance, a large electric current is likely to flow upon application of a voltage. A solution to prevent damage to the photoconductive element caused by the electric current may be to set the voltage to be applied to the photoconductive element to a small value. However, if the voltage to be applied to the photoconductive element is small, the acceleration of the photoexcited carriers is also small, resulting in the tendency of the intensity of generated terahertz radiation being reduced. This is because terahertz radiation is generated in accordance with the rate of change of the electric current with time between the electrodes, which is caused by the acceleration of the photoexcited carriers in the electric field within the photoconductive layer. Further, in a case where the above photoconductive element is used as a detection element, due to the low resistance, a large electric current is likely to be generated between the electrodes of the photoconductive element also under non-irradiation with excitation light. The generation of such an electric current may cause noise in the detection of terahertz radiation, and the signal-to-noise (SN) ratio at which the electric field strength of the terahertz radiation is detected may be reduced.

SUMMARY OF THE INVENTION

In an aspect of the present invention, a photoconductive element for performing at least one of generation and detection of terahertz radiation includes a photoconductive layer formed of a semiconductor material and configured to generate photoexcited carriers by being irradiated with excitation light, and a plurality of electrodes provided on the photoconductive layer. The material of the photoconductive layer is a material that makes a depletion layer produced in the photoconductive layer has a thickness smaller than an optical absorption length of the photoconductive layer for a wavelength of the excitation light. A film thickness of the photoconductive layer is adjusted so that the depletion layer is formed over an entirety in a direction of the film thickness within at least a portion of the photoconductive layer between the plurality of electrodes.

Further features of the present invention will become apparent from the following description of exemplary embodiments with reference to the attached drawings.

DESCRIPTION OF THE EMBODIMENTS

A photoconductive element according to the present invention is configured to adjust the thickness of a photoconductive layer so that a depletion layer produced in the photoconductive layer reaches the entirety in the film thickness direction within at least a portion of the photoconductive layer. In view of taking into account the absorption of excitation light, the thickness of the photoconductive layer is generally increased. The increase in thickness may increase the absorption of excitation light and increase the number of carriers generated by the excitation light, thereby increasing the power of generated terahertz radiation. In contrast, the photoconductive element according to the present invention, conversely, the thickness of a photoconductive layer made of a material that makes the depletion layer have a thickness smaller than the optical absorption length for the wavelength of excitation light is adjusted to be thinner. On the basis of this idea, the photoconductive element according to the present invention basically has the configuration described above.

Embodiments of the present invention will now be described with reference to the drawings.

First Embodiment

Figure 1A:
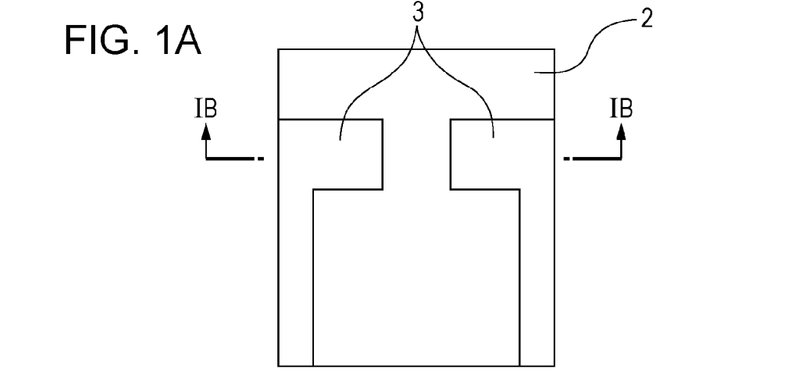
FIG. 1A is a top view of a photoconductive element according to a first embodiment.
Figure 1B:
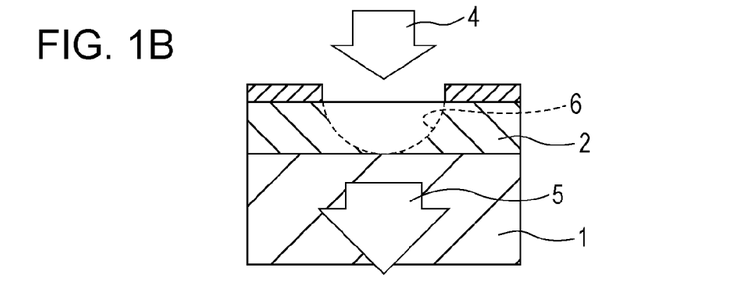
FIG. 1B is a cross-sectional view taken along the line IB-IB of FIG. 1A.
Figure 1C:
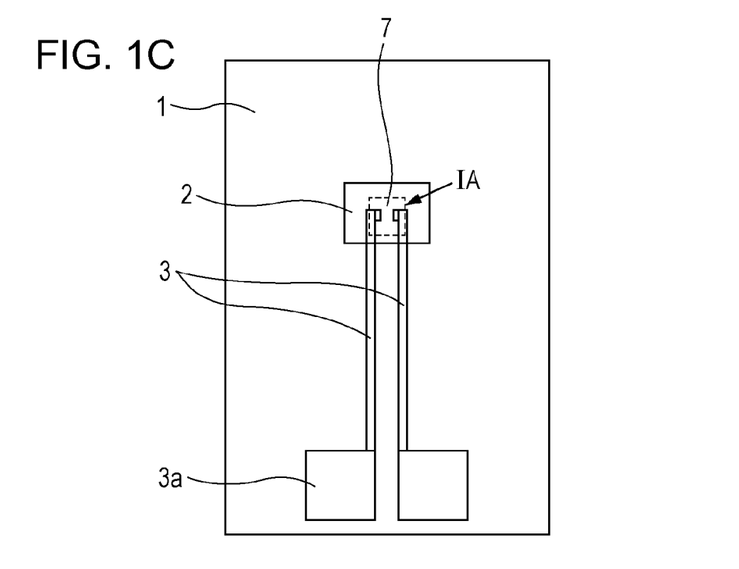
FIG. 1C is an overall view of the photoconductive element according to the first embodiment.

A photoconductive element according to a first embodiment of the present invention will be described with reference to FIGS. 1A to 1C and 2. FIG. 1A is a schematic top view illustrating the configuration of the photoconductive element according to this embodiment, FIG. 1B is a cross-sectional view taken along the line IB-IB of FIG. 1A, and FIG. 1C is an overall view of the photoconductive element according to this embodiment. FIG. 1A is an enlarged illustration of a dotted line portion (terahertz radiation detection/generation area (7)) in FIG. 1C that is irradiated with excitation light (4) so that terahertz radiation (5) is generated or detected. As illustrated in FIGS. 1A to 1C, the photoconductive element according to this embodiment includes a high-resistance substrate (1), a photoconductive layer (2), and a plurality of electrodes (3).

The material, arrangement, and the like of the components of the photoconductive element according to this embodiment will now be described. The high-resistance substrate (1) may be made of a high insulating material. This is because the resistance of the photoconductive element is increased by reducing the electric current flowing in the high-resistance substrate (1). Here, the resistance of the photoconductive element represents the resistance between pads (3a) of the electrodes (3) illustrated in FIG. 1C. The high-resistance substrate (1) typically has a resistivity greater than or equal to about 103 ohm·cm. The high-resistance substrate (1) may be made of a material such as semi-insulating indium phosphide (SI—InP) or semi-insulating gallium arsenide (SI—GaAs). The high-resistance substrate (1) may also be made of a material that is less absorbed in the frequency range of terahertz radiation (5), such as silicon (Si), or a resin material.

In this embodiment, the photoconductive layer (2) is arranged on the top surface of the high-resistance substrate (1). The photoconductive layer (2) is made of a material that is irradiated with excitation light (4) to generate photoexcited carriers. Examples of the material include low-temperature-grown indium gallium arsenide (In0.53Ga0.47As) grown at a temperature lower than or equal to 300° C. using the molecular-beam epitaxial growth method for excitation light (4) with a wavelength in the 1.5 μm band. The excitation light (4) may be pulsed light or continuous light. A typical example of a pulsed light source may be a light source of erbium fiber laser light having a pulse width of 50 fs. In this case, terahertz radiation having a wide frequency band can be generated or detected using terahertz time domain spectroscopy (THz-TDS). For continuous light, light of two types of frequencies with the frequency difference falling in the terahertz range is used as the excitation light (4). In this case, terahertz radiation having a narrow frequency band can be generated or detected.

The photoconductive layer (2) may be made of a ternary semiconductor material that is a material having a high absorption coefficient in the wavelength of the excitation light (4). For example, in addition to In0.53Ga0.47As used for the excitation light (4) with a wavelength in the 1.5 μm band described above, In0.4Ga0.6As or the like may be used for the excitation light (4) with a wavelength in the 1 μm band. The above materials generally have many defects and are prone to have a low resistance. However, in this embodiment, since a depletion layer (6) is formed in a manner described below, the above problem can be overcome in a manner described below. Further, the photoconductive layer (2) may not necessarily be formed over the entire top surface of the high-resistance substrate (1), and may be formed in an area that is irradiated with the excitation light (4) so that photoexcited carriers are generated. The combination of the photoconductive layer (2) and the excitation light (4) allows the band gap of the semiconductor material of the photoconductive layer to be smaller than the photon energy of the excitation light, and photoexcited carriers are generated by the inter-band transition under irradiation with light.

The electrodes (3) are arranged on the top of the photoconductive layer (2). The electrodes (3) may be in direct contact with the photoconductive layer (2) or may be in contact with the photoconductive layer (2) with an insulating layer, a contact layer, or the like disposed therebetween. In this embodiment, the plurality of electrodes (3) may be an electrode pair formed on the photoconductive layer (2). However, any number, shape, arrangement, and the like of electrodes may be used if an electric field can be generated over an area having a certain range in the photoconductive layer (2). For example, as illustrated in FIG. 1A, the electrodes (3) may be formed into an antenna shape in the vicinity of the area where the terahertz radiation (5) is generated in order to emit the terahertz radiation (5) to the outside of the photoconductive element. Examples of the antenna shape may include a dipole antenna and a bow-tie antenna. Examples of the material of the electrodes (3) may include gold-germanium (AuGe)/nickel (Ni)/gold (Au) and titanium (Ti)/gold (Au). In this embodiment, furthermore, as illustrated in FIG. 1C, the electrodes (3) have pads (3a) for supplying a voltage from outside the photoconductive element. For the electrodes (3), one of the pair of electrodes (3) may be disposed on the side of the photoconductive layer (2) near the high-resistance substrate (1). Alternatively, both the pair of electrodes (3) may be disposed on the side of the photoconductive layer (2) near the high-resistance substrate (1). Alternatively, the electrodes (3) may be disposed in the photoconductive layer (2).

The material of the photoconductive layer (2) may be a material that makes the depletion layer (6) generated in the photoconductive layer (2) have a thickness smaller than the optical absorption length of the photoconductive layer (2) for the wavelength of the excitation light (4). The amount of absorption of the excitation light (4) by the photoconductive layer (2) is represented by $$I = I_0(1 - \exp(-z/L)) \qquad (1)$$

where I denotes the amount of absorption of the excitation light (4) by the photoconductive layer (2), $I_0$ denotes the amount of excitation light (4) incident on the photoconductive layer (2), L denotes the optical absorption length, and z denotes the thickness of the photoconductive layer (2). According to Equation (1), the amount of absorption of the excitation light (4) by the photoconductive layer (2) increases in accordance with the increase in the thickness of the photoconductive layer (2).

The thickness of the depletion layer (6) formed on the photoconductive layer (2) is represented by $$W = (2 \in V_{bi} e n)^{0.5} \qquad (2)$$

where W denotes the thickness of the depletion layer (6), $\in$ denotes the dielectric constant of the photoconductive layer (2), $V_{bi}$ denotes the built-in potential on the surface of the photoconductive layer (2), e denotes the elementary charge, and n denotes the carrier density of the photoconductive layer (2). For example, the optical absorption length for the excitation light (4) with a wavelength of 1.5 μm in low-temperature-grown $In_{0.53}Ga_{0.47}As$ grown at a temperature of 250° C. is 1.25 μm. If the carrier density of the photoconductive layer (2) is $10^{15}$ $cm^{-3}$, the thickness of the depletion layer (6) formed on the photoconductive layer (2) is estimated to be 0.8 μm in accordance with Equation (2). In other words, the thickness of the depletion layer (6) is smaller than the optical absorption length. A material satisfying this condition can be used as the material of the photoconductive layer (2). The film thickness of the photoconductive layer (2) is adjusted to the thickness of the depletion layer (6), thus further increasing the resistance of the photoconductive element. Therefore, the intensity of terahertz radiation generated from the photoconductive element can further be improved, and the SN ratio at which terahertz radiation is detected can further be improved.

Next, the principle upon which the photoconductive element generates terahertz radiation (5) will be described. In this embodiment, a portion of the photoconductive layer (2) corresponding to the gap between the electrode pair (3) is irradiated with the excitation light (4) (see FIG. 1B). Here, the excitation light (4) may be pulsed light, or may also be continuous light. The excitation light (4) is absorbed in the photoconductive layer (2), and photoexcited carriers are generated inside the photoconductive layer (2). The generated photoexcited carriers are accelerated by the electric field applied to the gap by the electrodes (3). This behavior occurs at the time when the photoconductive layer (2) is irradiated with the excitation light (4). Therefore, irradiation with the excitation light (4) causes the electric current flowing in the photoconductive layer (2) to change with time. Pulses of the terahertz radiation (5) are generated by an electric current changing with time in the above manner. The electric field strength of the generated terahertz radiation (5) in the far field is represented by $$E_{THz} \propto \mu E_{bias} dn/dt \qquad (3)$$

where $E_{THz}$ denotes the electric field strength of the terahertz radiation (5), μ denotes the carrier mobility in the photoconductive layer (2), $E_{bias}$ denotes the electric field inside the photoconductive layer (2) generated by the application of the voltage to the electrodes (3), and dn/dt denotes the time change in the number of carriers. If pulsed light is used as the excitation light (4), photoexcited carriers are generated by the excitation light (4) and instantaneous conduction occurs. According to Expression (3), the electric field strength of the terahertz radiation (5) increases in accordance with the increase in the carrier mobility in the photoconductive layer (2), the electric field in the photoconductive layer (2) generated by the application of a voltage to the electrodes (3), and the time change in the number of carriers.

Next, the principle upon which the photoconductive element detects terahertz radiation (5) will be described. In this embodiment, the electric field generated by the terahertz radiation (5) causes the photoexcited carriers generated inside the photoconductive layer (2) by the excitation light (4) to move in the gap between the electrode pair (3). The electrons and holes move in opposite directions, and a net electric current occurs between the electrodes (3). e magnitude of the electric current is represented by $$I \propto \mu \int E_{THz} n dt \qquad (4)$$

where I denotes the electric current, μ denotes the carrier mobility in the photoconductive layer (2), $E_{THz}$ denotes the electric field strength of the terahertz radiation (5), n denotes the number of carriers, and t denotes time. The electric field strength of the terahertz radiation (5) can be detected by detecting the electric current with the electrodes (3).

Figure 2:
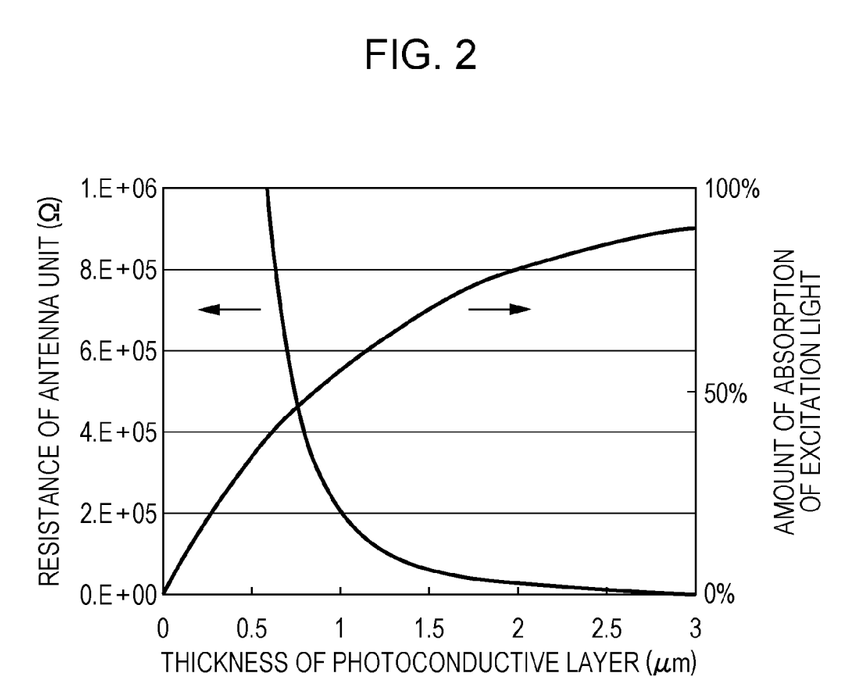
FIG. 2 is a graph illustrating an example of a change in the resistance of an antenna unit and the amount of absorption of excitation light with respect to the thickness of the photoconductive layer.

The advantages of this embodiment will be described with reference to FIG. 2. FIG. 2 illustrates an example of the relationship between the amount of absorption of the excitation light (4) and the resistance of an antenna unit of the photoconductive element with respect to the film thickness of the photoconductive layer (2). First, a description will be given of a case where the photoconductive element is used as an element for generating the terahertz radiation (5). As illustrated in FIG. 2, the amount of absorption (ratio) of the excitation light (4) to the amount of incident light increases in accordance with the increase in the film thickness of the photoconductive layer (2). The amount of absorption of the excitation light (4) tends to be in proportion to the number of carriers generated by the excitation light (4). According to Expression (3), the time change in the number of carriers tends to be in proportion to the electric field strength of the terahertz radiation (5). Therefore, in terms of the number of carriers generated by the excitation light (4), there is a tendency for the electric field strength of the terahertz radiation (5) to decrease if the film thickness of the photoconductive layer (2) decreases.

In contrast, as illustrated in FIG. 2, the resistance of the photoconductive element decreases in accordance with the increase in the film thickness of the photoconductive layer (2). If the photoconductive element has a high resistance, the electric current can be reduced even if the voltage applied to the electrodes (3) increases. Thus, if the photoconductive element has a high resistance, the voltage applied to the electrodes (3) can be increased. According to Expression (3), the electric field strength of the terahertz radiation (5) can be increased as the electric field inside the photoconductive layer (2) increases. Therefore, in terms of the resistance of the photoconductive element, there is a tendency for the electric field strength of the terahertz radiation (5) to be improved if the film thickness of the photoconductive layer (2) decreases.

Accordingly, the influences of the film thickness of the photoconductive layer (2) on the electric field strength of the terahertz radiation (5) in terms of the amount of absorption of the excitation light (4) and the resistance of the photoconductive element have opposite effects. In this embodiment, for example, as can be seen from FIG. 2, the resistance greatly increases with respect to a film thickness less than or equal to 0.8 μm that is equal to the thickness of the depletion layer (6). If the photoconductive layer (2) has a thickness of 0.8 μm, the antenna unit in the photoconductive element has a resistance of about 400 kΩ. Conventionally, the photoconductive layer (2) has a thickness of, for example, approximately 1.6 μm, and the antenna unit in the photoconductive element in this case has a resistance of about 50 kΩ. In this embodiment, in contrast, the resistance is as high as about 400 kΩ. Thus, a high voltage can be applied while the electric current flowing between the electrodes (3) is maintained low. Therefore, the acceleration of the photoexcited carriers is increased, and the rate of change of the electric current with time between the electrodes (3) is improved, resulting in improved intensity of terahertz radiation generated from the photoconductive element. Furthermore, the electric current that does not contribute to the generation of the terahertz radiation (5) can be reduced, and the terahertz radiation (5) can be efficiently generated. Since a further reduction in the thickness of the photoconductive layer (2) makes the amount of absorption of the excitation light (4) smaller, the thickness of the photoconductive layer (2) may be equal to about the thickness of the depletion layer (6) given by Equation (2).

Next, a description will be given of a case where the photoconductive element is used as a detection element for detecting the terahertz radiation (5). In the detection element, the electric current flowing under non-irradiation of the photoconductive element with the excitation light (4) causes noise, and the SN ratio at which the terahertz radiation (5) is detected is reduced. The element configuration illustrated in this embodiment can improve the resistance of the photoconductive element, and can reduce the flow of electric current described above. Therefore, noise can be reduced, and the SN ratio at which the terahertz radiation (5) is detected can be improved.

This embodiment has been described in the context of the photoconductive layer (2) that is made of InGaAs, by way of example. Such low-temperature-grown compound semiconductors composed of three or more elements (such as indium gallium antimonide (InGaSb), indium gallium arsenide phosphide (InGaAsP), and aluminum gallium arsenide (AlGaAs)) have a higher defect density than GaAs which is traditionally used for photoconductive elements, resulting in a thinner depletion layer. However, the present invention can also be applied to the above materials, and provides the following advantages: In compound semiconductors with a relatively high defect density, more free carriers are produced and a depletion layer formed on a surface of a photoconductive layer is likely to be thinner. The resistance is low if the thickness of the depletion layer does not reach the thickness of the photoconductive layer, and compound semiconductors composed of three or more elements generally have a low resistance. In the technique disclosed in Japanese Patent Laid-Open No. 2006-86227 described above, an InGaAs layer capable of efficiently absorbing excitation light in the 1.5 μm band, which is used in optical fiber technology, is used as a photoconductive layer, and the thickness of the photoconductive layer is set to, for example, 1.5 μm. The thickness of the photoconductive layer is generally set in accordance with the relationship with the amount of absorption of excitation light. In the technique disclosed in Japanese Patent Laid-Open No. 2006-86227 described above, the optical absorption length of the InGaAs layer to the wavelength of the 1.5 μm band is about 1.25 μm, and therefore the thickness of the photoconductive layer is set to a value greater than or equal to the optical absorption length in order to absorb a larger amount of excitation light. As described above, if the photoconductive element has a low resistance, the intensity of generated terahertz radiation is likely to be low, and the SN ratio at which the electric field strength of the terahertz radiation is detected is likely to be reduced. To address the inconvenience, Japanese Patent Laid-Open No. 2006-86227 further describes an example in which iron (Fe) ions are injected into the photoconductive layer to improve the resistance of the photoconductive element. This may increase the possibility of high-intensity terahertz radiation being generated or terahertz radiation being detected at a high SN ratio by a photoconductive element suitable for excitation light in the 1.5 μm band. The injection of iron ions into the photoconductive layer may increase the resistance of the photoconductive element. However, the injection of iron ions may cause another issue of carrier mobility reduction. The mobility contributes to the improved electric field strength of terahertz radiation generated from the photoconductive element or the improved SN ratio of terahertz radiation detected by the photoconductive element, and the mobility reduction is not desirable. In contrast, the photoconductive element according to this embodiment does not involve the injection of iron ions or the like but provides a photoconductive layer of which at least a portion between electrodes is made thinner than the depletion layer. Thus, the photoconductive element can have a relatively high resistance without causing the reduction in mobility.

Second Embodiment

Figure 3A:
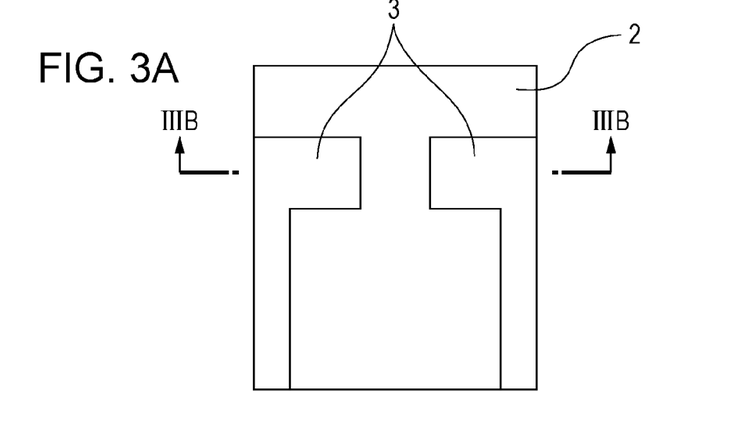
FIG. 3A is a top view of a photoconductive element according to a second embodiment.
Figure 3B:
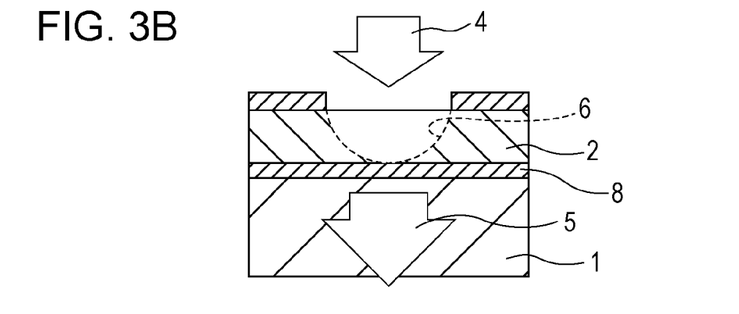
FIG. 3B is a cross-sectional view taken along the line IIIB-IIIB of FIG. 3A.
Figure 3C:
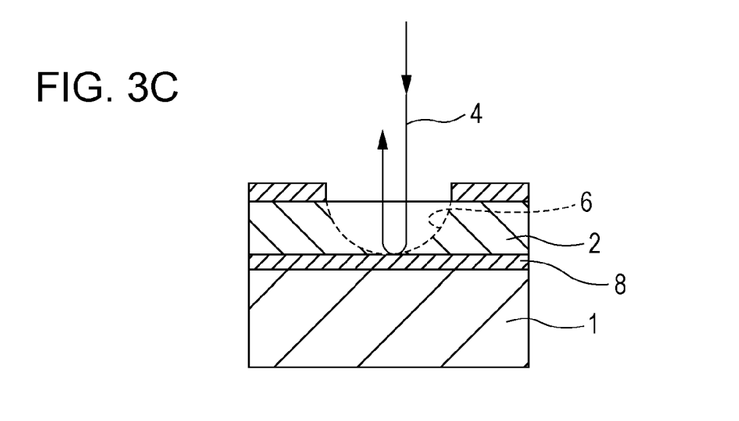
FIG. 3C is a diagram illustrating an example of an optical path of excitation light in the photoconductive element according to the second embodiment.

A photoconductive element according to a second embodiment of the present invention relates to a modification of the photoconductive element described above. The description of portions common to those described above will be omitted. This embodiment will be specifically described with reference to FIGS. 3A to 3C. The photoconductive element according to this embodiment is configured such that a reflection unit (8) is arranged in a portion irradiated with excitation light (4) on a surface of the photoconductive layer (2) opposite to the excitation light incidence side. That is, the reflection unit (8) is arranged in contact with the photoconductive layer (2) on a surface of the photoconductive layer (2) opposite to the side to which the excitation light (4) is incident. The reflection unit (8) reflects the excitation light (4) transmitted through the photoconductive layer (2) and causes the excitation light (4) to enter the photoconductive layer (2). FIG. 3C illustrates an example of an optical path of the excitation light (4) in the photoconductive element according to this embodiment.

The reflection unit (8) may be made of a material having a refractive index different from that of the photoconductive layer (2). For example, a distributed bragg reflector (DBR) mirror can be used. The DBR mirror may be formed of, for example, a multi-layer structure of InP and InGaAs if the high-resistance substrate (1) is made of InP. The DBR mirror may be formed by, for example, fabricating ten pairs of $In_{0.53}Ga_{0.47}As$ layers/InP layers on the high-resistance substrate (1) using a molecular-beam epitaxial growth method. The thickness of each layer may be set to a thickness of $\lambda/4$, where $\lambda$ is the wavelength of the excitation light (4) in the layer. The reflection unit (8) may also be made of a metal material. Such a photoconductive element may be fabricated by, for example, arranging a reflection unit (8) composed of titanium (Ti)/gold (Au) between the high-resistance substrate (1) and the photoconductive layer (2). The arrangement can be performed using the so-called transfer process. For example, when a photoconductive layer (2) composed of InGaAs is formed on an InP substrate, first, a reflection unit (8) composed of titanium (Ti)/gold (Au) or the like is formed into a thickness of approximately 0.2 μm on the photoconductive layer (2) using an evaporation method. Next, the substrate is polished from the side opposite to the photoconductive layer (2) so as to obtain a thickness of approximately 100 μm. Next, the surface on which the reflection unit (8) is formed is adhered to a high-resistance substrate (1) using an appropriate method with contacts aligned. Examples of the adhesion method include a method using an adhesive made of resin, and a method using gold-tin (AuSn) bonding. Next, the substrate is removed by etching and thereafter electrodes (3) are formed on the photoconductive layer (2).

The reflection unit (8) produced in the above manner allows the excitation light (4) transmitted through the photoconductive layer (2) to enter the photoconductive layer (2) again (see FIG. 3C). Therefore, the length of the optical path of the excitation light (4) in the photoconductive layer (2) can be increased by about twice. As in the first embodiment, the thickness of the photoconductive layer (2) may also be set to 0.8 μm, thus allowing the optical path length of the excitation light (4) to be approximately 1.6 μm. As can be seen from FIG. 2, the amount of absorption with respect to the amount of incident excitation light (4) can be improved to about 80% from about 50%. In the generation of terahertz radiation (5), as can be seen from Expression (3), the increase in the amount of absorption of the excitation light (4) improves the electric field strength of the terahertz radiation (5). In addition, in the detection of terahertz radiation (5), as can be seen from Expression (4), the increase in the amount of absorption of the excitation light (4) improves the SN ratio at which the electric field strength of the terahertz radiation (5) is detected. Therefore, according to this embodiment, the increase in the amount of absorption of the excitation light (4) can increase the rate of change of the electric current with time between the electrodes (3), and can further improve the electric field strength of the generated terahertz radiation (5). Furthermore, the number of photoexcited carriers produced during the irradiation with excitation light can be increased, and the number of excited carriers accelerated by the electric field of the detected terahertz radiation, that is, the electric current flowing between the electrodes (3), can be increased. In this manner, the electric current (signal component) during irradiation with excitation light can be increased, and therefore the SN ratio at which the electric field strength of the terahertz radiation (5) is detected can further be improved.

Third Embodiment

A third embodiment of the present invention relates to a terahertz radiation analysis apparatus configured to analyze information about a specimen using terahertz radiation. In this embodiment, information about a specimen is analyzed using terahertz time-domain spectroscopy (THz-TDS). The description of portions common to those described above will be omitted. This embodiment will be specifically described with reference to FIG. 4.

Figure 4:
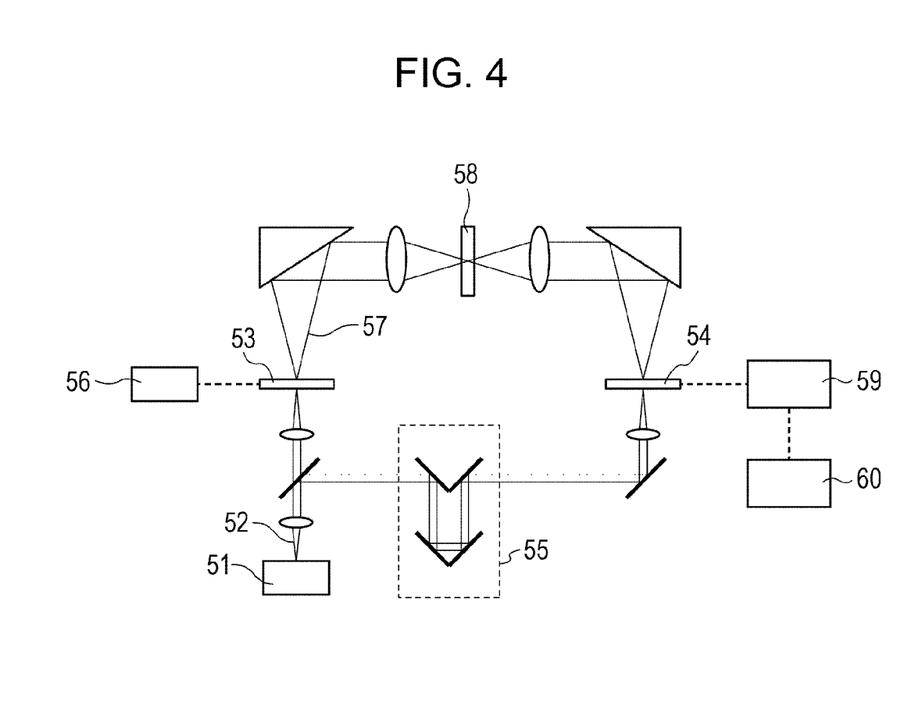
FIG. 4 is a diagram illustrating an example configuration of a terahertz radiation analysis apparatus according to a third embodiment.

Excitation light (52) is generated from an excitation light source (51) serving as an excitation light generation unit. The excitation light source (51) may be a femtosecond laser. The femtosecond laser typically has a pulse width of 50 fs and has a repetition frequency of 50 MHz. The excitation light (52) is split by a beam splitter into a beam traveling toward a photoconductive element (53) for generating terahertz radiation (57) and a beam traveling toward a detection-side photoconductive element (54) for detecting terahertz radiation (57). The photoconductive element (53) uses the photoconductive element described in the first or second embodiment to improve the intensity of the terahertz radiation (57). A voltage is applied to the electrodes (3) of the photoconductive element (53) using a voltage source (56). For example, a voltage of approximately 10 V is applied. The photoconductive element (53) is irradiated with the excitation light (52) to generate terahertz radiation (57). Here, the method described in the first or second embodiment may be used to make the excitation light (52) incident. The terahertz radiation (57) emitted from the photoconductive element (53) is applied to a specimen (58) through an optical system including a parabolic mirror and a lens. The excitation light (52) traveling toward the photoconductive element (54) is delayed in time using a delay unit (55). Any kind of delay unit capable of adjusting the delay time between the time at which terahertz radiation is generated from a generation-side photoconductive element and the time at which terahertz radiation is detected using the detection-side photoconductive element may be used. The time-delayed excitation light (52) and the terahertz radiation (57) transmitted through or reflected from the specimen (58) are applied to the photoconductive element (54). In the detection-side photoconductive element (54), the electric current proportional to the electric field strength of the terahertz radiation (57) that has reached the photoconductive element (54) at the same timing as the excitation light (52) is generated.

A processing unit (59) analyzes information about the specimen (58) using the electric current signal. For example, information on the thickness of the specimen (58) can be obtained by recording the magnitude of an electric current signal obtained when the specimen (58) is moved with the delay time applied to the excitation light (52) being made constant by the delay unit (55). Alternatively, the delay time may be changed with the specimen (58) fixed, and the time waveform of the terahertz radiation (57) may be obtained using standard time domain spectroscopy. Spectra may be calculated using Fourier transform of the time waveform, and the absorption band of the specimen (58) may be compared with that in a database to identify a substance. A process result is displayed on a display unit (60) and is used for screening of defective or the like.

In the above analysis apparatus, the photoconductive element (53) on the generation side or the photoconductive element (54) on the detection side may be implemented using the photoconductive element described in the first or second embodiment. If the photoconductive element is used on the generation side, the electric field strength of the terahertz radiation (57) can be improved. Further, if the photoconductive element is used on the detection side, the SN ratio at which the electric field strength of the terahertz radiation (57) is detected can be improved. In the analysis apparatus according to this embodiment, only the part configured to generate the terahertz radiation (57) or only the part configured to detect the terahertz radiation (57) can be used in an independent manner. As described above, according to this embodiment, the specimen (58) can be analyzed using terahertz radiation (57) with improved electric field strength. Furthermore, the specimen (58) can be analyzed with the improved SN ratio at which the electric field strength of the terahertz radiation (57) is detected. Therefore, the analysis accuracy of the analysis apparatus can be improved, and, for example, the accuracy of process analysis defective inspection or the speed of obtaining a security image can be increased.

While exemplary embodiments of the present invention have been described, the present invention is not limited to the embodiments, and a variety of modifications and changes can be made without departing from the scope of the invention.

Furthermore, the technical elements described herein or illustrated in the drawings exert technical utility separately or in combination, and are not limited to a combination of claims as originally filed. Moreover, the techniques described herein or illustrated by way of example in the drawings are intended to simultaneously achieve a plurality of purposes, and have technical utility by achieving one of the purposes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-044839 filed Mar. 2, 2010, which is hereby incorporated by reference herein in its entirety.

What is claimed is:

1. A photoconductive element for performing at least one of generation and detection of terahertz radiation, comprising:
    a photoconductive layer configured to generate photoexcited carriers by being irradiated with excitation light; and a plurality of electrodes provided on the photoconductive layer, wherein the material of the photoconductive layer is a material that makes a depletion layer produced in the photoconductive layer have a thickness smaller than an optical absorption length of the photoconductive layer for a wavelength of the excitation light, wherein the material of the photoconductive layer is a material in which the thickness W of the depletion layer produced in the photoconductive layer is represented by $W=(2 \in V_{bi}/en)^{0.5}$, where $\in$ denotes a dielectric constant of the photoconductive layer, Vbi denotes a built-in potential on a surface of the photoconductive layer, e denotes an elementary charge, and n denotes a carrier density of the photoconductive layer, wherein a film thickness of the photoconductive layer is selected to the thickness W of the depletion layer within at least a portion of the photoconductive layer between the plurality of electrodes, and wherein the material of the photoconductive layer is a low-temperature-grown compound semiconductor including three or more elements.

2. The photoconductive element according to claim 1, wherein a reflection unit configured to reflect the excitation light is arranged in a portion irradiated with the excitation light on a surface of the photoconductive layer opposite to a side to which the excitation light is incident.

3. A terahertz radiation analysis apparatus comprising:
a generation-side photoconductive element configured to generate terahertz radiation;
a detection-side photoconductive element configured to detect the generated terahertz radiation and transmitted through or reflected from a specimen;
a delay unit configured to adjust a delay time between a time at which terahertz radiation is generated and a time at which terahertz radiation is detected; and
a processing unit configured to analyze information about the specimen from an electric current signal obtained in the detection-side photoconductive element,
wherein at least one of the generation-side photoconductive element and the detection-side photoconductive element comprises the photoconductive element according to claim 1.

4. The apparatus according to claim 3, wherein a reflection unit configured to reflect the excitation light is arranged in a portion irradiated with the excitation light on a surface of the photoconductive layer of the photoconductive element opposite to a side to which the excitation light is incident.

5. The apparatus according to claim 1, wherein the material of the photoconductive layer is InGaAs.

6. The apparatus according to claim 3, wherein the material of the photoconductive layer is InGaAs.

* * * * *